United States Patent [19]

Tanaka et al.

[11] Patent Number: 4,524,382
[45] Date of Patent: Jun. 18, 1985

[54] FILTER CIRCUITS

[75] Inventors: Yutaka Tanaka; Takashi Okada, both of Yokohama, Japan

[73] Assignee: Sony Corporation, Tokyo, Japan

[21] Appl. No.: 396,396

[22] Filed: Jul. 8, 1982

[30] Foreign Application Priority Data

Jul. 13, 1981 [JP] Japan ................................ 56-109101

[51] Int. Cl.³ .......................................... H04N 9/535
[52] U.S. Cl. .......................................... 358/31; 358/36
[58] Field of Search .................. 358/31, 36, 37, 167, 358/166; 307/231, 510, 516, 520

[56] References Cited

U.S. PATENT DOCUMENTS 4,050,084  9/1977  Rossi ..................................... 358/31
4,422,094  12/1983  Lewis .................................... 358/31
4,438,454  3/1984  Shanley ................................. 358/31

Primary Examiner—Michael A. Masinick
Attorney, Agent, or Firm—Lewis H. Eslinger; Alvin Sinderbrand

[57] ABSTRACT

A filter circuit has an input terminal supplied with an input signal to be filtered, a signal sampling circuit for detecting a level of the input signal at plural predetermined different points spaced apart from each other and producing plural detected signals, which includes a logical operating circuit for producing a filtered output signal of a desired waveform by processing the adjacent signals of the plural detected signals based on a predetermined logical formula.

18 Claims, 38 Drawing Figures $f_{t-1} = f_t \neq f_{t+1}$ $f_{t-1} \neq f_t = f_{t+1}$ $f_{t-1} = f_{t+1} \neq f_t$ F I G. 7A
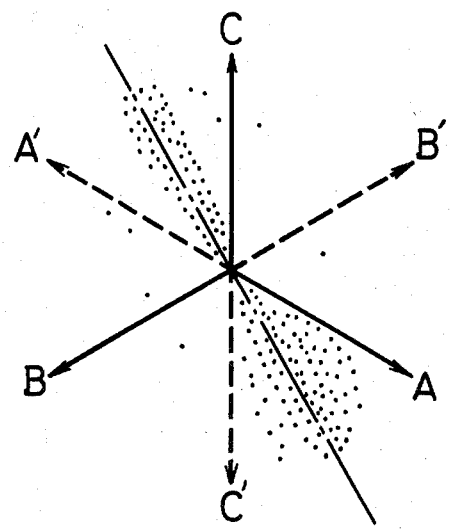
F I G. 7B
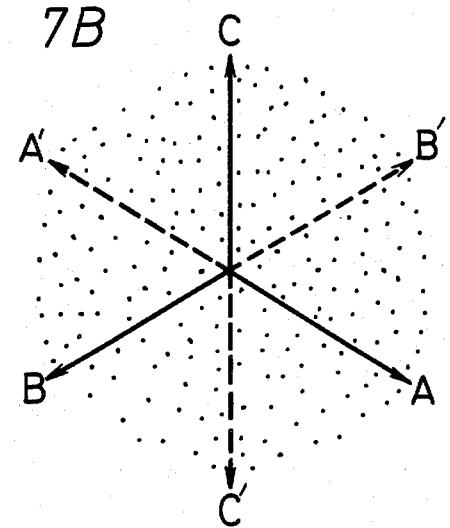

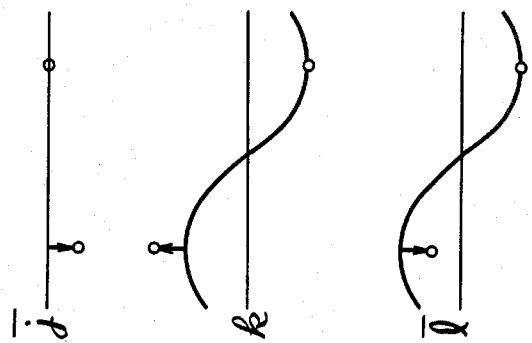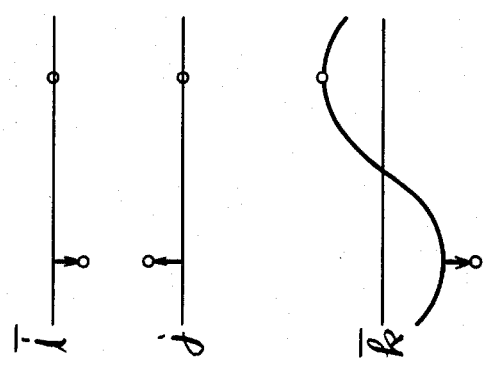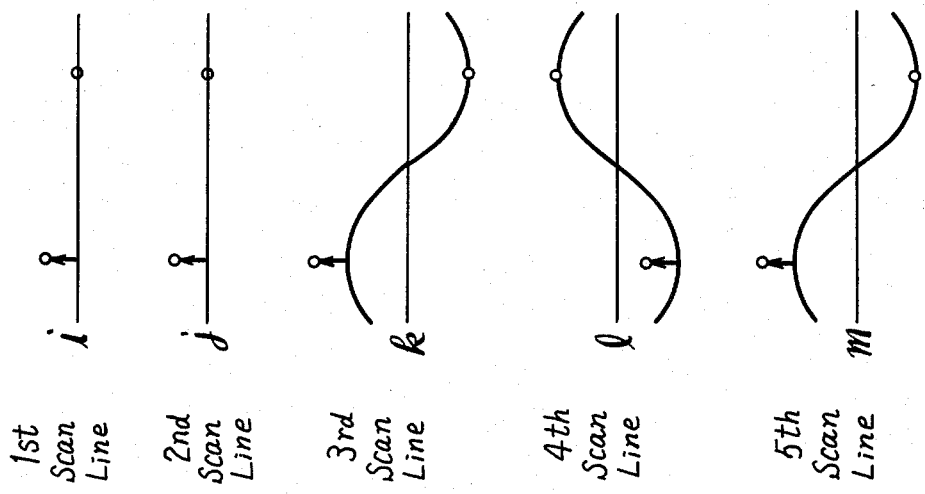

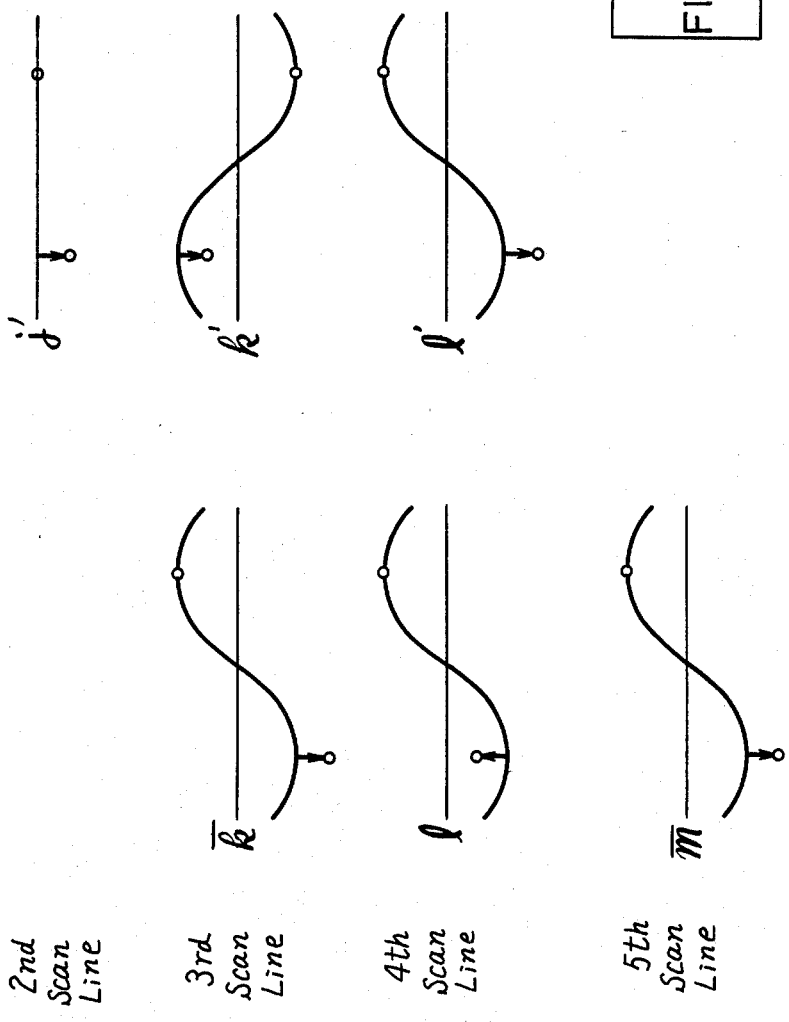
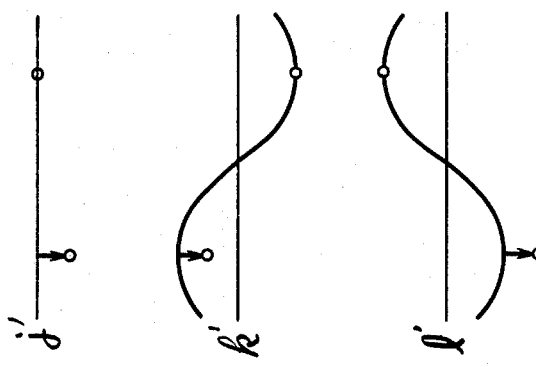
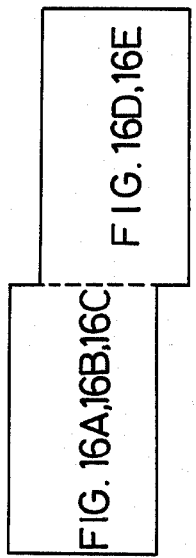

FIG. 17A     FIG. 17B
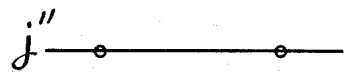
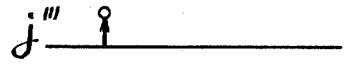
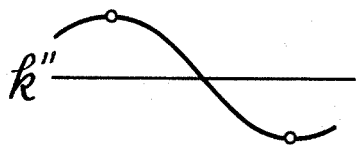
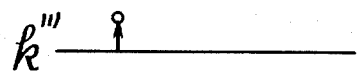
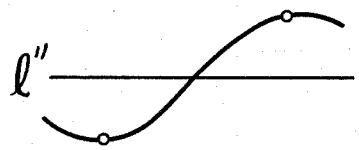
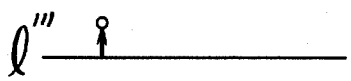

F I G. 19A 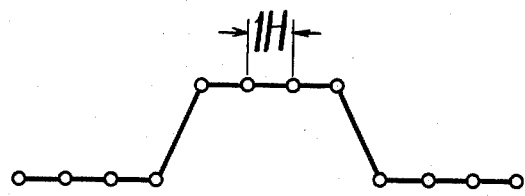
F I G. 19B 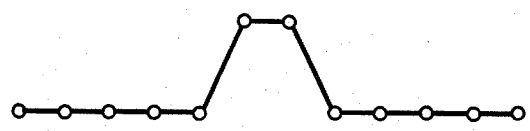
F I G. 19C 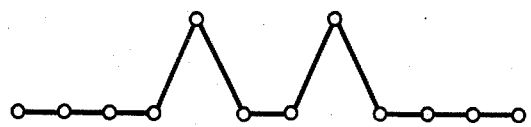
F I G. 19D 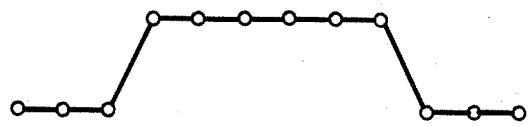
F I G. 19E 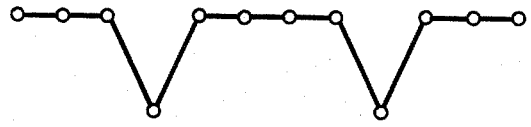
F I G. 19F 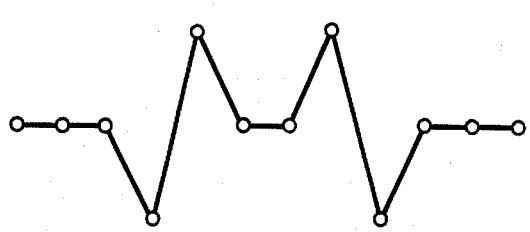
F I G. 19G 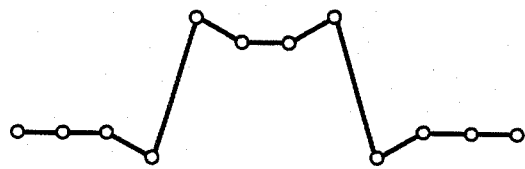

FILTER CIRCUITS

BACKGROUND OF THE INVENTION

1. Field of the Invention

This invention relates generally to filter circuits, and more particularly relates to a filter circuit based on a novel concept which can eliminate noise only without deteriorating an original signal or derive only the desired signal from a plurality of mixed or composed signals without distortion.

2. Description of the Prior Art

To derive an original signal from a signal containing noises $N_1$ to $N_3$ as, for example, shown in FIG. 1A, it has been previously proposed to use a low pass filter so as to eliminate such noises $N_1$ to $N_3$. But, in accordance with such previous method, the original signal thus derived therefrom is blunted at its rising-up edges as shown in FIG. 1B and hence the signal is deteriorated.

Also, for a filter for separating a luminance signal Y and a chrominance signal C from a color video signal of national television systems committee (NTSC) system, there is proposed a so-called comb filter which takes advantage of the fact that a vertical correlativity of a picture screen and a phase of a subcarrier of the chrominance signal C are inverted at every one horizontal period. FIG. 2 shows a circuitry thereof, in which a composite video signal Y+C applied to an input terminal 101 is supplied to an adding circuit 102 and a subtracting circuit 103, and the signal applied to the input terminal 101 is supplied through a one horizontal period (1H) delay circuit 104 to the adding circuit 102 and the subtracting circuit 103. Then, the signals 2Y and 2C derived from the above adding circuit 102 and the subtracting circuit 103 are respectively delivered through attenuators 105 and 106, each used to attenuate the level of the signal applied thereto to be one-half the original signal, to output terminals 107 and 108.

Next, the operation of the prior art comb filter shown in FIG. 2 will be described. Now, let us assume that, as shown in FIG. 3A, the input terminal 101 is supplied with such a signal including, for example, five successive scanning lines components, in which first and second signals i and j thereof are only the luminance signal Y of a constant level, while third, fourth and fifth signals k, l and m thereof are a mixed or composed signal of the luminance signal Y and the chrominance signal C, both being at the constant level. In the above, it is also assumed that a signal preceding the first scanning line be equal to the first scanning line signal i.

When the input terminal 101 is supplied with the signal denoted by letter i in FIG. 3A, at the output of the delay circuit 104, there appears a signal with a waveform same as that of the signal i one horizontal period (1H) before. Accordingly, the output signal from the adding circuit 102 becomes a signal with an amplitude twice that of the signal i. This signal is supplied to and attenuated to be one-half in level by the attenuator 105, so that at the output terminal 107 is developed such a signal as shown by letter i' of FIG. 3B, which is the same as the first scanning line signal i of FIG. 3A. Moreover, the output of the subtracting circuit 103 becomes zero so that at the output terminal 108 is produced a signal whose luminance signal component is removed as shown by letter i" in FIG. 3C. Next, when the input terminal 101 is supplied with the signal denoted by letter j of FIG. 3A, similarly to the above, at the output terminal 107 is produced the luminance signal j' shown in FIG. 3B, while at the output terminal 108 is produced the signal j" of FIG. 3C containing no luminance signal Y.

When the input terminal 101 is supplied with the signal denoted by k in FIG. 3A, the 1H delay circuit 104 produces the signal shown by j in FIG. 3A. Accordingly, at the output from the adding circuit 102, the level of the luminance signal Y becomes twice high the original level, while the level of the chrominance signal C is the same as that of the signal k. Therefore, at the output terminal 107 is produced a signal k' shown in FIG. 3B where the level of the luminance signal Y thereof is the same as that of the input signal k in FIG. 3A, and the level of the chrominance signal C is one-half that of the input signal k. Furthermore, from the output terminal 108 is derived a signal shown by k" in FIG. 3C where the chrominance level is one-half and the luminance signal component is eliminated.

Next, when the input terminal 101 is supplied with the signal denoted by letter l in FIG. 3A, the 1H delay circuit 104 produces the signal k. Comparing the signal k with the signal l, it is seen that the luminance signals Y thereof are in the same phase and in the same level, while the chrominance signals C thereof are in the opposite phase, but the same level, so at the output terminal 107 is produced only the luminance signal Y with the same level as that of the input signal as shown by letter l' in FIG. 3B. Whereas, at the output terminal 108 is produced only the chrominance signal C with the same level as that of the input signal as shown by letter l" in FIG. 3C.

Next, when the input terminal 101 is supplied with the signal denoted by letter m in FIG. 3A, similarly to the signal l, at the output terminal 107 is produced only the luminance signal Y as shown by m' in FIG. 3B, while at the output terminal 108 is produced only the chrominance signal C shown by m" in FIG. 3C.

Specifically, in the prior art comb filter shown in FIG. 2, when the signals in the adjacent scanning lines have a vertical correlativity therebetween, it is possible to perfectly separate the luminance signal Y from the chrominance signal C. But, when they have no vertical correlativity therebetween or, for example, when the signal j of the second scanning line is changed into the signal k of the third scanning line, as shown by the signal k' of FIG. 3B, the chrominance signal C is mixed into the output terminal 107 for providing the luminance signal Y, to cause a dot interference. Also, as shown by the signal k" of FIG. 3C, the level of the chrominance signal C is attenuated to be one-half the original level thereof thus the vertical resolution being deteriorated.

OBJECTS AND SUMMARY OF THE INVENTION

Accordingly, it is an object of this invention to provide a novel filter circuit which is free from the signal deterioration.

It is another object of this invention to provide a filter circuit which can waveform-shape a waveform of an input signal to a predetermined waveform.

It is still another object of this invention to provide a filter circuit which can remove a noise from a signal without distorting the waveform of the desired signal.

It is further object of this invention to provide a filter circuit where in a comb filter for separating a luminance signal and a chrominance signal from a composite signal, even when the luminance signal and the chrominance signal have no vertical correlativity therebetween, a dot interference will never be caused and a vertical resolution will never be deteriorated.

It is yet further object of this invention to provide a filter circuit by which an input signal is waveform-shaped into a predetermined waveform to thereby enable an aperture correction to be performed.

According to an aspect of the present invention, there is provided a filter circuit comprising:

(a) an input terminal supplied with an input signal to be filtered;

(b) a signal sampling means for detecting a level of said input signal at plural predetermined different points spaced apart from each other, and producing plural detected signals; characterized in that said filter circuit further comprising:

(c) logical operating means for producing a filtered output signal of a desired waveform by processing the adjacent signals of said plural detected signals based on a predetermined logical formula.

The other objects, features and advantages of the present invention will become apparent from the following description taken in conjunction with the accompanying drawings through which the like references designate the same elements and parts.

BRIEF DESCRIPTION OF THE DRAWINGS

FIGS. 4, 5A, 5B, 5C, 6, 7A, 7B, 8 and 9 are diagrams each used to explain the present invention;

FIGS. 16A to 16E and FIGS. 17A and 17B are diagrams each used to explain the filter circuit according to the other embodiment of the present invention;

FIGS. 19A through 19G are diagrams each used to explain the same;

DESCRIPTION OF THE PREFERRED EMBODIMENTS

With reference to the attached drawings, embodiments of the present invention will be described hereinafter.

First, a pattern space will be described. By way of example, it is assumed that a television signal of one frame is comprised of m picture elements in the horizontal direction and n picture elements in the vertical direction. If the amplitude of each of the picture elements be represented as $$f(x_i, y_j)$$

where $1 \leq i < m$ and $1 \leq j < n$ are established. Then, the aforesaid television signal can be regarded such one that $f(x_i, y_j)$ of $m \times n = k$ numbers are sequentially arranged therein.

For instance, if the above is expressed as $$f = (f_1, f_2, \ldots f_k)$$

where $f_1 = f(x_1, y_1)$

.
.
.

$$f_k = f(x_m, y_n)$$

then this television signal of one frame can be considered as a vector F of k dimensions.

A multidimensional space provided by expressing the levels of the signal at a plurality of time points for each dimension in the vector representation as described above is generally called a pattern space.

Similarly, by using levels $f_{t-1}$, $f_t$ and $f_{t+1}$ (where $2 \leq t < k - 1$), it is possible to construct a pattern space of three dimensions.

Figure 1A:
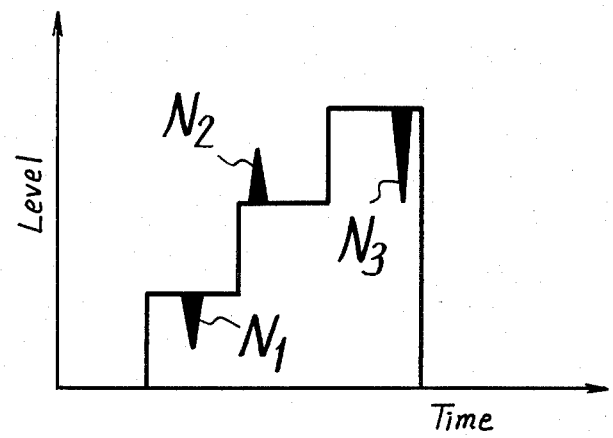
FIGS. 1A and 1B are waveform diagrams each used to explain a prior art filter circuit.
Figure 1B:
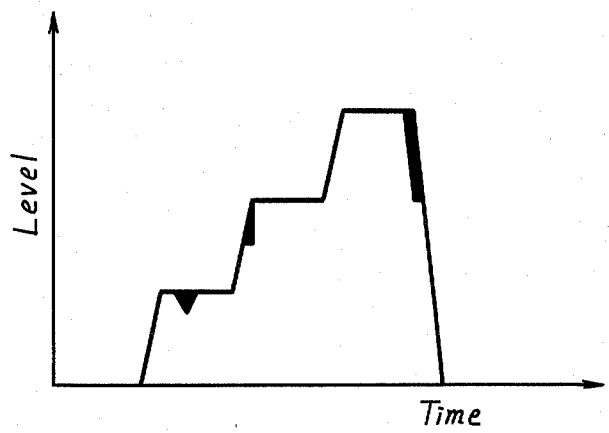
Figure 2:
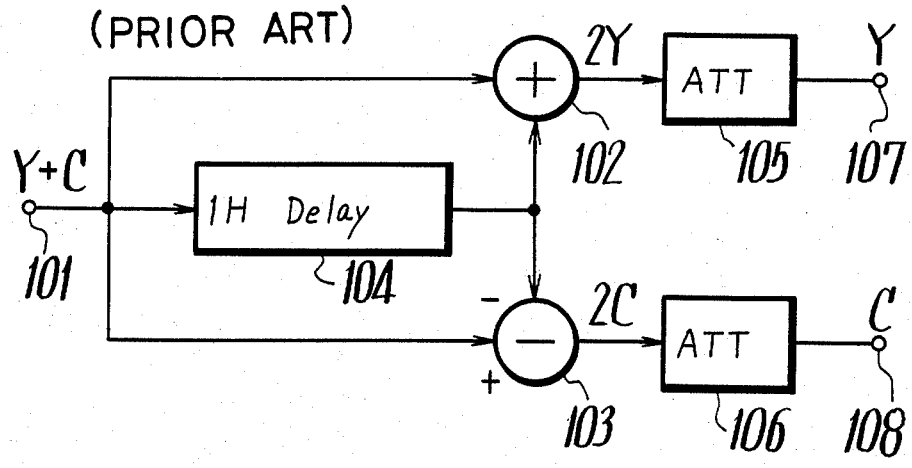
FIG. 2 is a block diagram showing an example of a prior art comb filter circuit.
Figure 3:
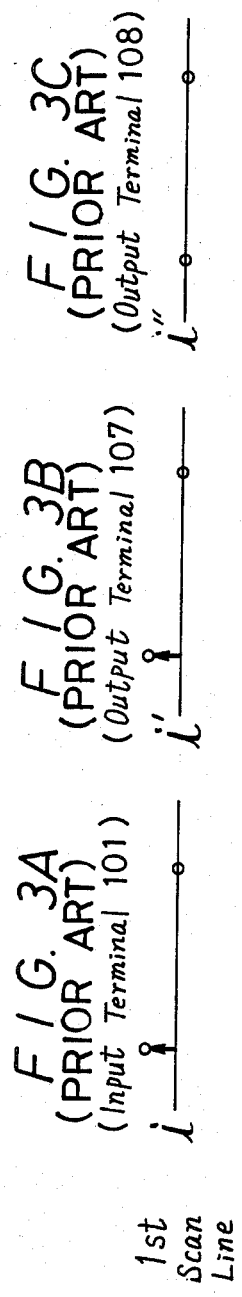
FIGS. 3A to 3C are diagrams each used to explain the prior art filter circuit.
Figure 4:
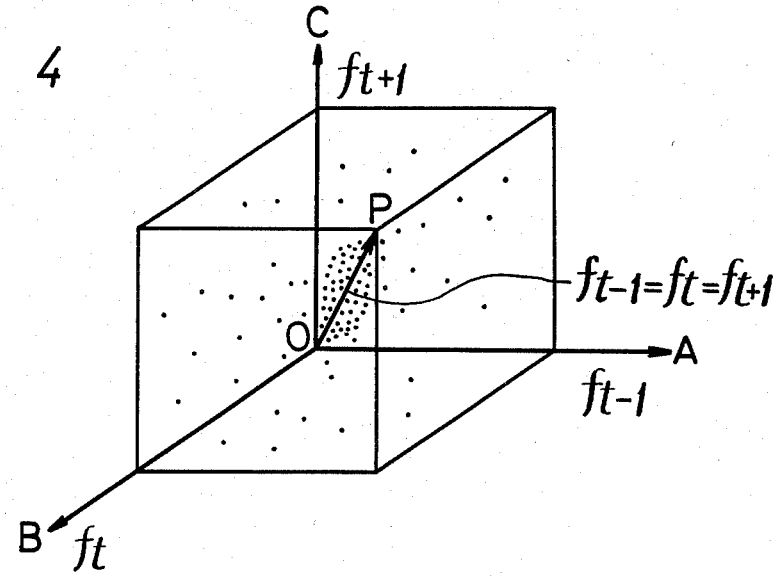

FIG. 4 is a perspective diagram showing such three dimensional pattern space, in which respective vectors are expressed at given points within the space encircled by the maximum levels of the signal.

In this three dimensional pattern space, a line connecting an original point O with a point P where the vector at maximum value indicates the following equations.

$$f_{t-1} = f_t = f_{t+1}$$

Figure 5A:
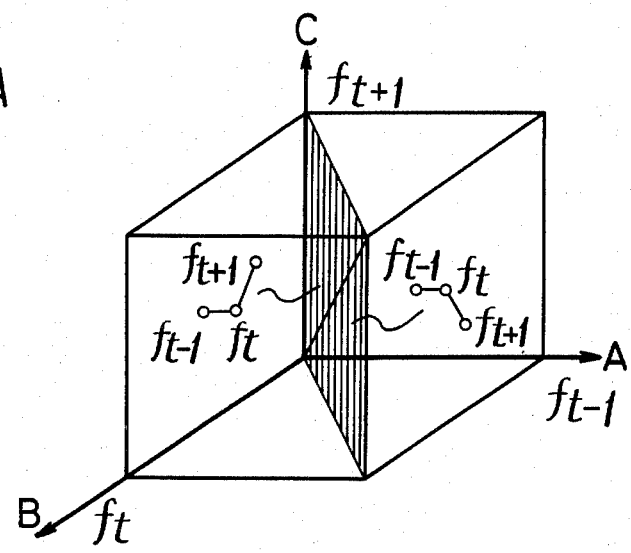

Also, a plane shown in FIG. 5A indicates the following conditions.

$$f_{t-1} = f_t \neq f_{t+1}$$

Figure 5B:
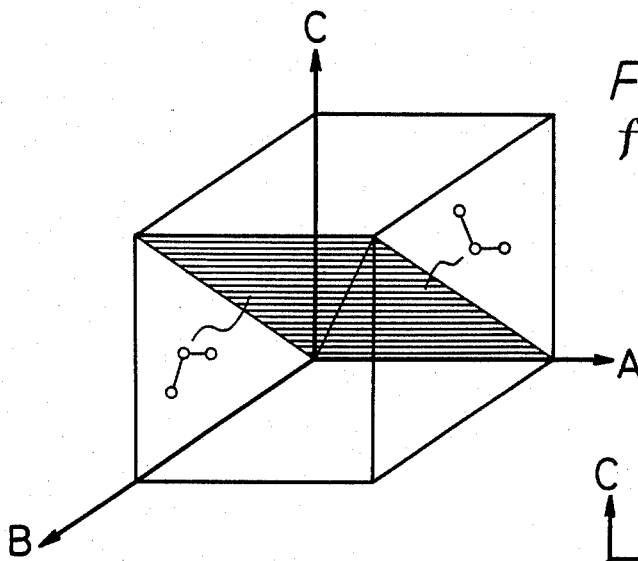

Further, a plane shown in FIG. 5B indicates the conditions as given by $$f_{t-1} \neq f_t = f_{t+1}$$

so these represent the fact that the signal is varied stepwise.

Figure 5C:
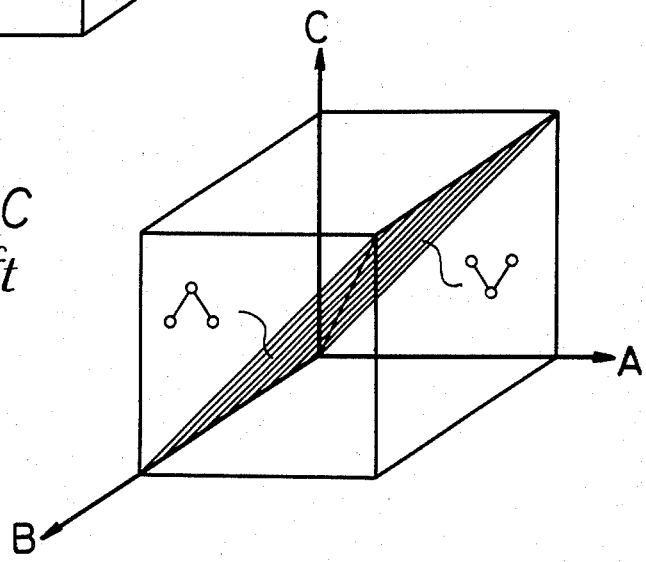

Whereas, a plane shown in FIG. 5C indicates the conditions as given by $$f_{t-1} = f_{t+1} \neq f_t,$$

which identifies that the signal is changed abruptly.

Figure 6:
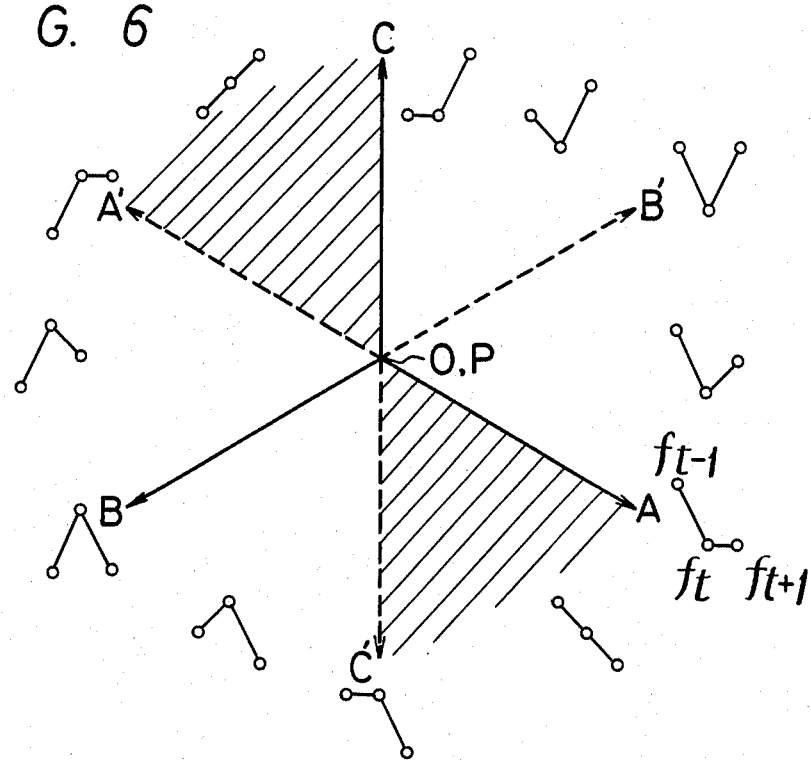

Seeing this three dimensional pattern space at a position extended from the line O-P makes such one as shown in FIG. 6, where the signals in the respective ranges are varied at the external periphery of the line O-P as shown in the figure. In the figure, the line O-P in FIG. 4 is shown by the center, the plane in FIG. 5A by the axis A, the plane in FIG. 5B by the axis B and the plane in FIG. 5C is shown by the axis C.

In this case, since the correlativity between the adjacent signals of the original signal is quite strong, the signals in the respective ranges are concentrated in distribution in a range from lines A-A' to C-C', while they do not exist at the vicinity of line B-B' as shown by the perspective diagrams with hatches of FIG. 6 and in FIG. 7A. Whereas, since a noise and so on have no correlativity between the adjacent signals, they are distributed uniformly on the whole as shown in FIG. 7B.

Figure 8:
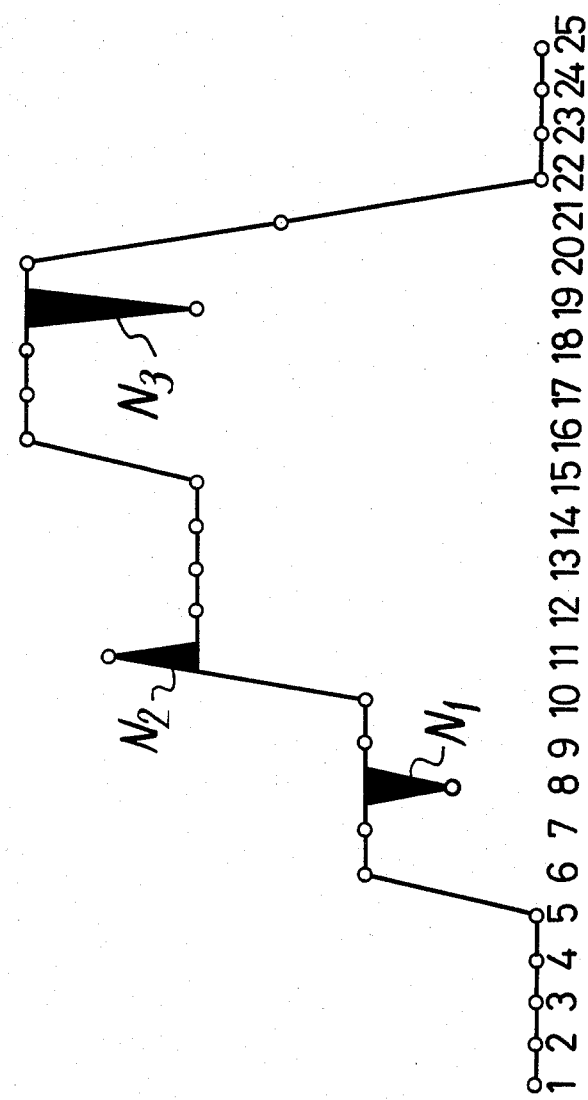
Figure 9:
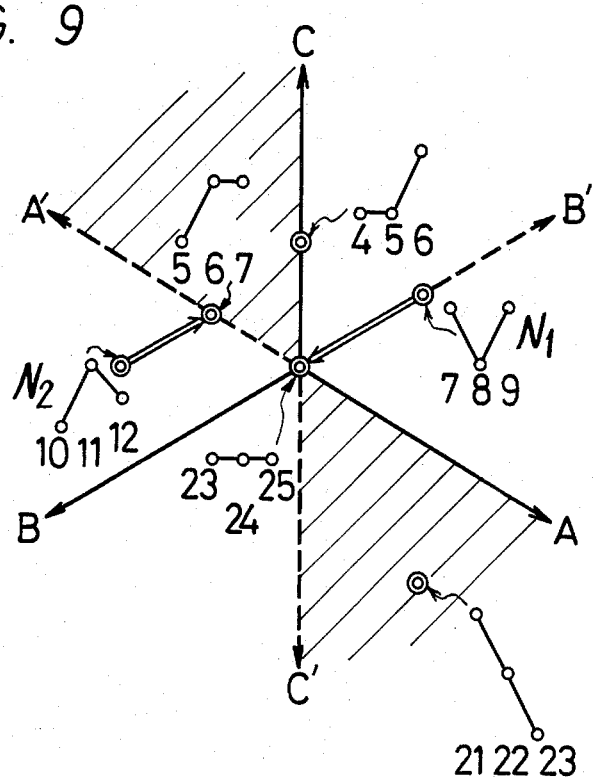

In case of such a signal as, for example, shown in FIG. 8, if this signal is converted to the aforesaid pattern space, it becomes as shown in FIG. 9. In FIG. 8, circles o denote the positions of the signal.

In this case, if the positions of the signals out of the ranges shown by hatchings in FIG. 9 are moved as, for example, shown by bold arrows, the noises $N_1$ to $N_3$ can be eliminated.

This movement can be performed by, for example, such a logical calculation as follows. That is, $$f_i' = \text{MAX}\{\text{MIN}(f_{i-1}, f_i), \text{MIN}(f_i, f_{i+1}), \text{MIN}(f_{i-1}, f_{i+1})\} \quad (1)$$

$$= \text{MIN}\{\text{MAX}(f_{i-1}, f_i), \text{MAX}(f_i, f_{i+1}), \text{MAX}(f_{i-1}, f_{i+1})\} \quad (2)$$

where a letter MAX implys that the maximum value in the following parenthese is selected therefrom, while MIN implys that the minimum value therein is selected therefrom. In other words, MAX represents an OR operation and MIN represents an AND operation, both being performed in analog fashion in the logical calculation.

If the above logical calculation is performed, the part of the noise $N_1$ of, for example, FIG. 8 becomes as follows.

$$f_8' = \text{MAX}\{\text{MIN}(f_7, f_8), \text{MIN}(f_8, f_9), \text{MIN}(f_7, f_9)\}$$

$$= \text{MAX}(f_8, f_8, f_7)$$

$$= f_7$$

Also, the part of the noise $N_2$ becomes as follows.

$$f_{11}' = \text{MAX}\{\text{MIN}(f_{10}, f_{11}), \text{MIN}(f_{11}, f_{12}), \text{MIN}(f_{10}, f_{12})\}$$

$$= \text{MAX}(f_{10}, f_{12}, f_{10})$$

$$= f_{12}$$

thus the noises $N_1$ and $N_2$ are eliminated. The noise $N_3$ can also be eliminated similarly to the noise $N_1$.

Whereas, for example, in the signal $f_5$, it becomes as follows.

$$f_5' = \text{MAX}\{\text{MIN}(f_4, f_5), \text{MIN}(f_5, f_6), \text{MIN}(f_4, f_6)\}$$

$$= \text{MAX}(f_4, f_5, f_4)$$

$$= f_5$$

Also, in the signal $f_6$, it becomes as follows.

$$f_6' = \text{MAX}\{\text{MIN}(f_5, f_6), \text{MIN}(f_6, f_7), \text{MIN}(f_5, f_7)\}$$

$$= \text{MAX}(f_5, f_6, f_5)$$

$$= f_6$$

thus the original signal is taken out as it is.

As stated above, according to the filter circuit of the present invention, it is possible to eliminate the noise without deteriorating the original signal.

Figure 10:
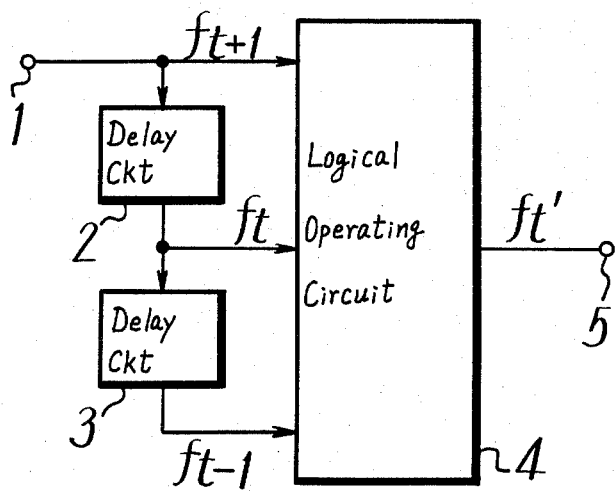
FIG. 10 is a circuit block diagram schematically showing one embodiment of a filter circuit according to the present invention.
Figure 11:
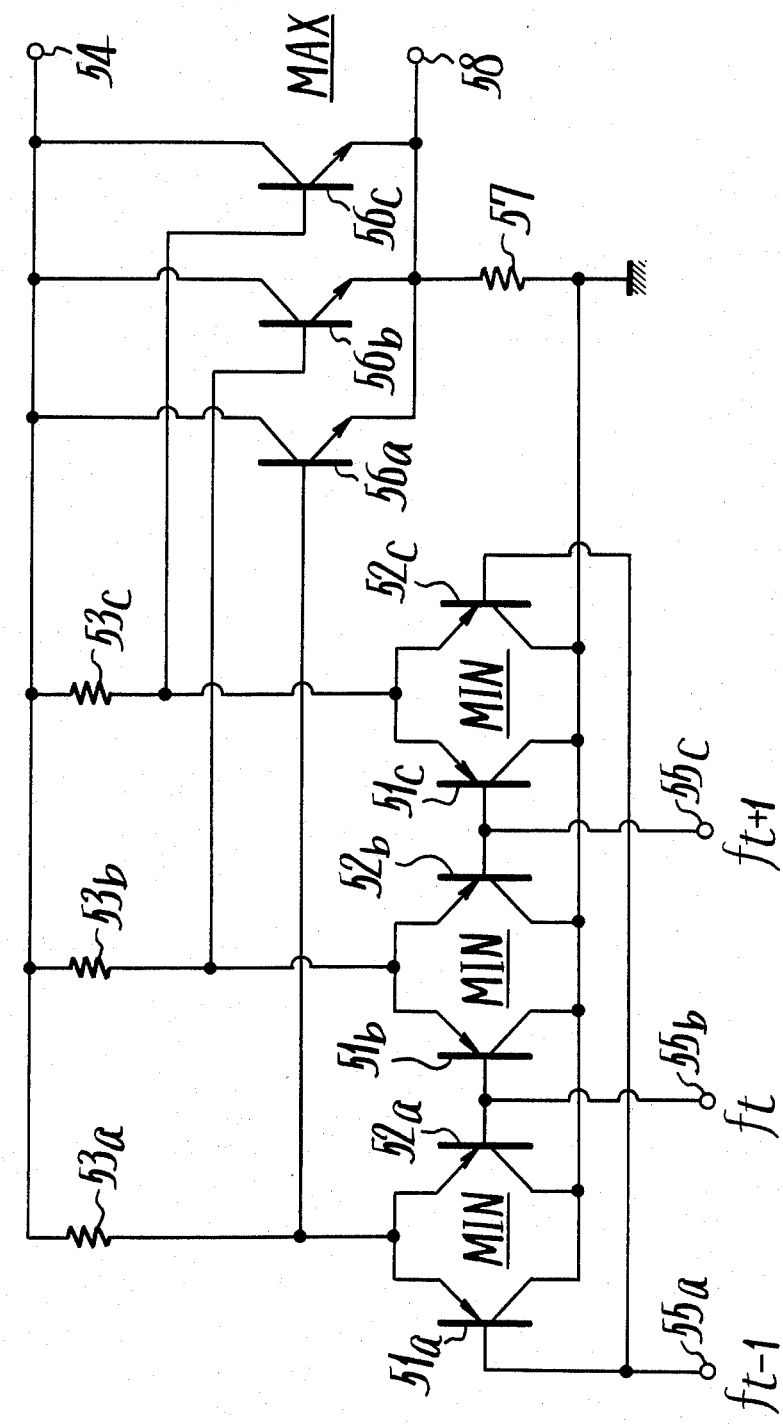
FIGS. 11 and 12 are connection diagrams each showing a practical example of the filter circuit of the present invention.
Figure 12:
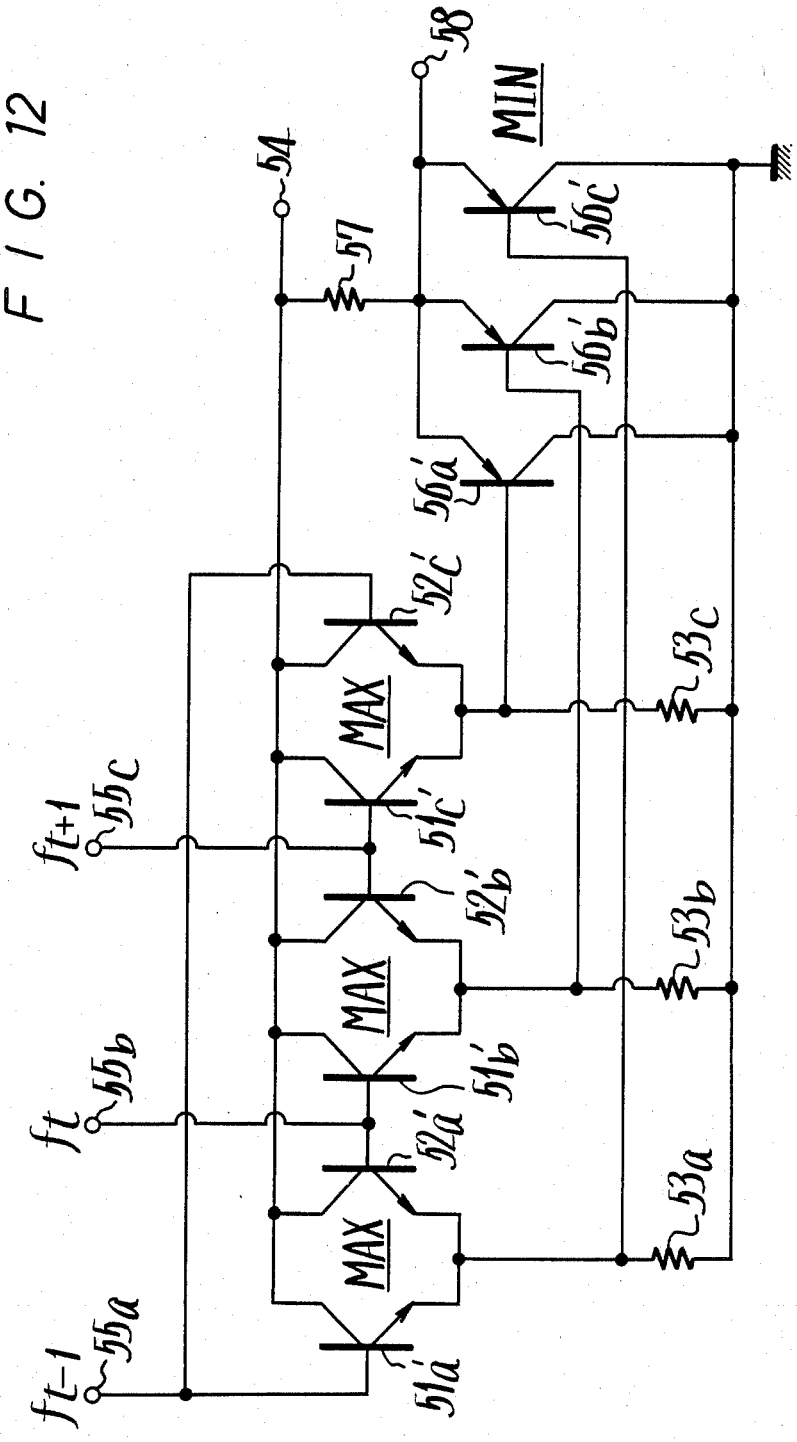

Further, FIGS. 10 to 12 show a practical circuit arrangement thereof.

First of all, FIG. 10 is a schematic diagram showing an overall arrangement thereof, wherein a signal applied to an input terminal 1 is supplied to a series circuit formed of delay circuits 2 and 3, each having a delay time equivalent to a period of the maximum frequency of the original signal. Further, the signal applied to the input terminal 1 and the output signals of the delay circuits 2 and 3 are all supplied to a logical operating circuit 4 to perform the logical calculations corresponding to the aforesaid logical formula (1) or (2), in which the signal is processed by logical operation and then derived at an output terminal 5.

The above logical operating circuit 4 is constructed as follows.

FIG. 11 is a connection diagram showing a practical circuit arrangement of the logical operating circuit 4 corresponding to the above logical formula (1). In the figure, there are provided three sets of circuits, each being formed of a pair of pnp-type transistors 51a, 52a; 51b, 52b; and 51c and 52c. The collectors thereof are grounded together, and the emitters of the transistors of each pair are connected to one other. The connection points of the emitters are connected through resistors 53a, 53b and 53c to a voltage supply source terminal 54 together. Moreover, there are provided terminals 55a, 55b and 55c to which signals $f_{i-1}$, $f_i$ and $f_{i+1}$ are respectively supplied. The terminal 55a is connected to the bases of the transistors 51a and 52c, the terminal 55b to the bases of the transistors 52a and 51b, and the terminal 55c to the bases of the transistors 52b and 51c. Furthermore, the afore-said connection points of the emitters of the transistors 51a to 52c are respectively connected to the bases of npn-type transistors 56a, 56b and 56c, while each collector of these transistors 56a to 56c is connected to the voltage supply source terminal 54. Also, the emitters thereof are connected together and this connection point thereamong is grounded by way of a resistor 57. The above connection point among the emitters of the transistors 56a to 56c is connected to an output terminal 58.

According to the circuitry of FIG. 11 thus composed, the first pair of the transistors 51a and 52a select the smaller signal from the signals supplied to the terminals 55a and 55b, the second pair of the transistors 51b and 52b select the smaller signal from the signals applied to the terminals 55b and 55c, and the third pair of the transistors 51c and 52c select the smaller signal from the signals applied to the terminals 55c and 55a. In other words, an AND output in the analog fashion can be provided by the circuit of FIG. 11. Further, the maximum signal is selected by the transistors 56a to 56c from the signals supplied from the transistors 51a to 52c, and then developed at the output terminal 58. In other words, an OR output in the analog fashion can be obtained by this circuit.

FIG. 12 is a connection diagram showing a practical circuitry of the logical operating circuit 4 corresponding to the foregoing logical formula (2). In this example, the pnp-type transistors 51a to 52c shown in FIG. 11 are respectively replaced by npn-type transistors 51a' to 52c', the npn-type transistors 56a to 56c thereof are respectively replaced by pnp-type transistors 56a' to 56c', and the voltage supply source terminal 54 and the ground thereof are reversed. In accordance with this circuitry of FIG. 12, the transistors 51a' to 52c' select the larger signals from those applied thereto, while the transistors 56a' to 56c' select the smaller signals from those applied thereto.

As will be clear from these figures, the filter circuit of the present invention can be effected by a quite simple circuit arrangement.

Hereinafter, further description will be given to other embodiments of the present invention, in which the present invention is applied to a separating filter for separating the luminance signal and the chrominance signal from the video signal of the national television systems committe (NTSC) system.

In the color video signal of the NTSC system, the phase of the subcarrier of the chrominance signal is inverted at every horizontal period. Therefore, instead of the aforesaid signals $f_{t-1}$, $f_t$ and $f_{t+1}$, a signal $f_t$, a signal $f_{t-H}$ of one horizontal period (H) before and a signal $f_{t+H}$ of one horizontal period after are employed to form a pattern space similar to the above.

Figure 13:
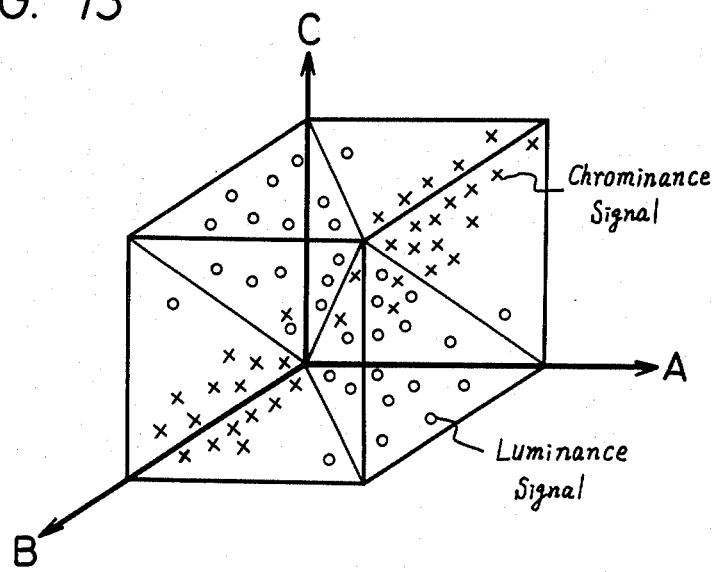
FIGS. 13 and 14 are diagrams each used to explain other embodiment of the present invention.
Figure 14:
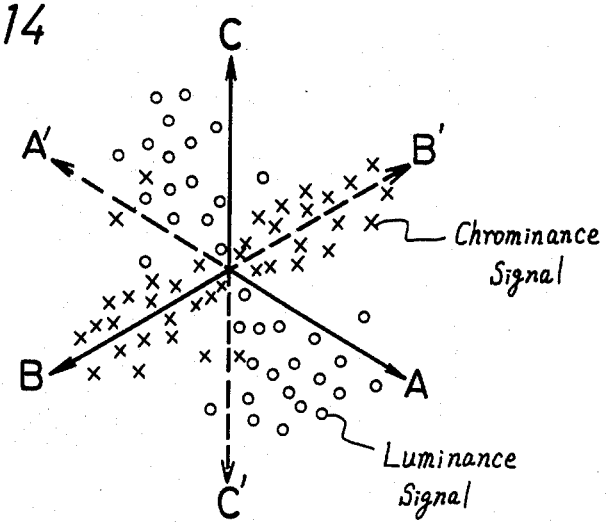

If so, as shown in FIGS. 13 and 14, the luminance signal components thereof are distributed between substantially the axes A and C, while the chrominance signal components thereof are distributed in the vicinity of axis B, where the luminance signal components and the chrominance signal components are respectively shown by o and x. Accordingly, when the chrominance signal is derived from the aforesaid signals, it is sufficient to perform the movement in the direction of the axis B on the pattern space.

Figure 15:
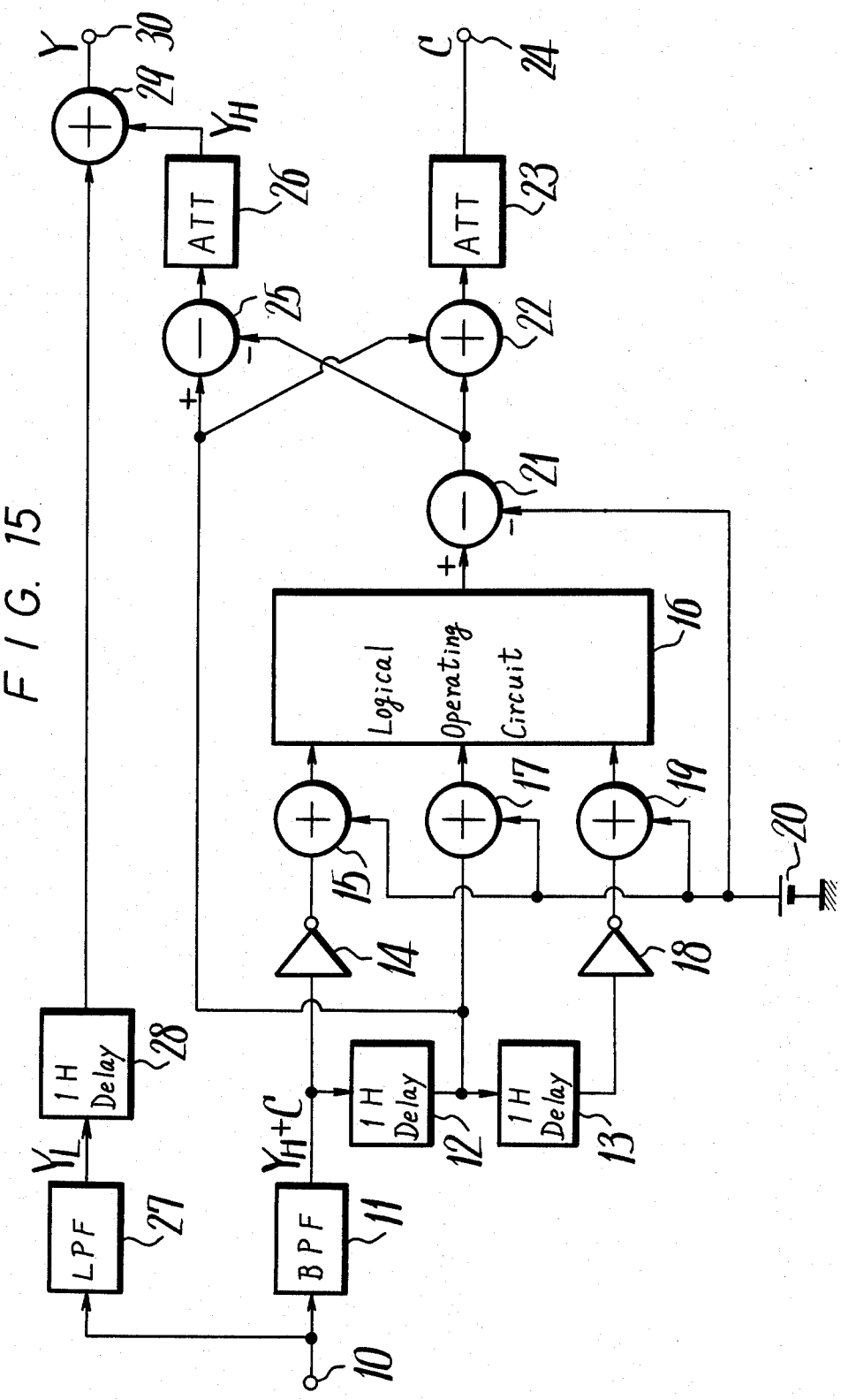
FIG. 15 is a circuit block diagram schematically showing a filter circuit according to other embodiment of the present invention.

FIG. 15 is a schematic block diagram showing a circuit to derive the chrominance signal from the video signal as described above. In the figure, a signal applied to an input terminal 10 is supplied to a band pass filter 11, from which the chrominance and high frequency components of the luminance signals are derived. The signals thus derived are supplied to a series circuit formed of delay circuits 12 and 13, each having a delay time equivalent to one horizontal period. Further, the signal derived from the band pass filter 11 is supplied through an inverter 14 and an adding circuit or adder 15 to a logical operating circuit 16. Also, the signal derived from the delay circuit 12 is supplied to the logical operating circuit 16 via an adder 17. Moreover, the signal from the delay circuit 13 is supplied to the logical operating circuit 16 by way of an inverter 18 and an adding circuit or adder 19. Furthermore, a DC voltage derived from a positive voltage source 20 is supplied to the adding circuits 15, 17 and 19 so as to perform the biasing to allow all of the signals to be supplied to the logical operating circuit 16 to become positive signals.

For the logical operating circuit 16, there is utilized such a circuit same as the above logical operating circuit 4 of FIG. 10.

Consequently, when the signals i, j, k, l and m of respective scanning lines as shown in FIG. 16A are supplied to the input terminal 10, at a time point where the chrominance signal j of the second scanning line is produced signals $\bar{i}$, j, and $\bar{k}$ as shown in FIG. 16B, are supplied to the logical operating circuit 16. Also, at a time point where the chrominance signal k of the third scanning line is produced, signals $\bar{j}$, k, and $\bar{l}$ as shown in FIG. 16C, are supplied to the logical operating circuit 16. Moreover, at a time point where the chrominance signal l of the fourth scanning line is produced, signals $\bar{k}$, l, and $\bar{m}$ as shown in FIG. 16D, are supplied to the logical operating circuit 16.

Since these signals are supplied to the logical operating circuit 16, the logical operating circuit 16 produces such signals j', k' and l' as shown in FIG. 16E.

Turning back to FIG. 15, these signals j', k' and l' are supplied to a subtracting circuit 21 where the biasing voltage from the positive voltage source 20 is subtracted therefrom. These signals j', k' and l' are supplied to an adding circuit 22, and the original signals j, k and l derived from the delay circuit 12 are also supplied to the adding circuit 22, where as shown by signals j", k" and l" in FIG. 17A, a luminance signal component $Y_H$ of a high frequency band is eliminated therefrom. The chrominance signal C whose luminance signal component is removed is supplied to an attenuator 23 in which the level thereof is attenuated one-half whereby the signal is made to have the same level as the original signal. This signal is developed at an output terminal 24.

The signals j', k' and l' from the subtracting circuit 21 are supplied to a subtracting circuit 25, and the original signals j, k and l derived from the delay circuit 12 are also supplied to the subtracting circuit 25, where as shown by signals j''', k''' and l''' in FIG. 17B, the chrominance signal component is eliminated therein. The high frequency band component of the luminance signal Y whose chrominance signal component is removed is supplied to an attenuator 26, which attenuates the level to be one-half whereby the signal is converted to have the level same as the level of the original signal.

Also, the signal applied to the input terminal 10 is supplied to a low pass filter 27, from which a luminance signal $Y_L$ of a low frequency band stopped by the aforesaid band pass filter 11 is produced. This luminance signal $Y_L$ is supplied through a delay circuit 28 having a time delay equal to one horizontal period to an adding circuit 29, and this adding circuit 29 is also supplied with the signal from the attenuator 26. Thus, the luminance signal Y where the high frequency band and low frequency band components are added to each other is produced at an output terminal 30.

Therefore, in accordance with this circuitry of FIG. 15, as will be obvious from FIGS. 17A and 17B, in case of no vertical correlativity between the signals on adjacent scanning lines, free from the dot interference and the deterioration of the vertical resolution, the luminance signal Y and the chrominance signal C can be separated.

Hereinafter, a further embodiment of the present invention where the filter circuit according to the present invention, is applied to a vertical aperture correction circuit of the video signal, will be described.

Figure 18:
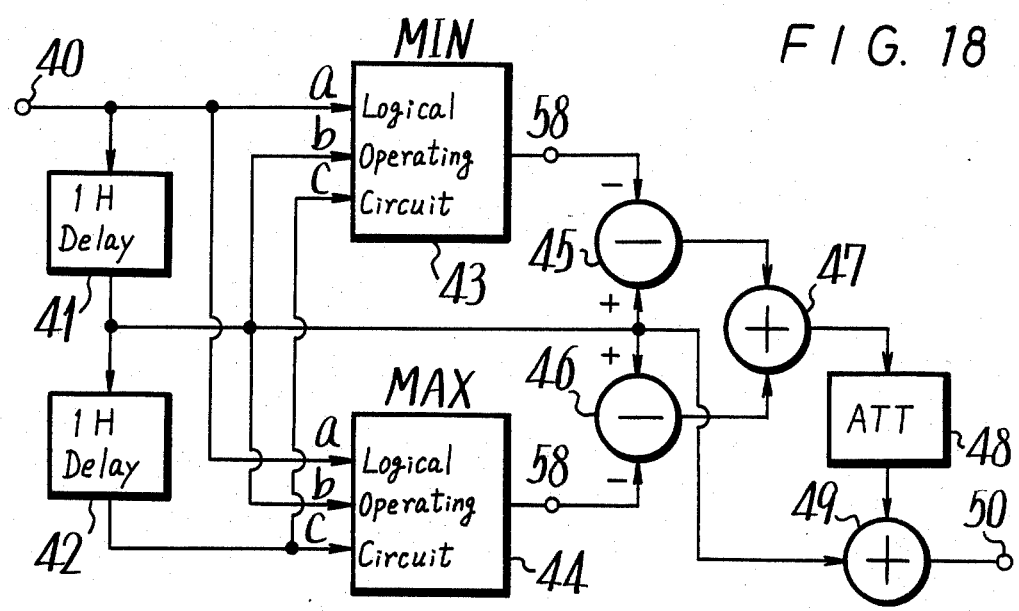
FIG. 18 is a circuit block diagram schematically showing a filter circuit according to further embodiment of the present invention.

FIG. 18 is a schematic block diagram thereof, in which a signal applied to an input terminal 40 is supplied to a series circuit formed of delay circuits 41 and 42, each having a time delay equivalent to one horizontal period. The signal applied to the input terminal 40 and the output signals from the delay circuits 41 and 42 are respectively supplied to logical operating circuits 43 and 44. The logical operating circuit 43 performs the logical operation as follows.

$$f_t' = MIN (f_{t-H}, f_t, f_{t+H})$$

whereas, the logical operating circuit 44 performs the logical operation as follows.

$$f_t' = MAX (f_{t-H}, f_t, f_{t+H})$$

The signal from the delay circuit 41 is supplied to subtracting circuits 45 and 46, and the signals from the logical operating circuits 43 and 44 are also supplied to the subtracting circuits 45 and 46, whereby the latter is subtracted from the output of the delay circuit 41. The signals derived from these subtracting circuits 45 and 46 are added to each other by an adding circuit 47. The added signal therefrom is supplied through an attenuator 48 to an adding circuit 49, while the signal from the delay circuit 41 is supplied to the adding circuit 49, so the signal from this adding circuit 49 is produced at an output terminal 50.

Consequently, in accordance with this circuitry of FIG. 18, when the signal at every one horizontal period, namely, the signal in case that the screen is seen vertically is changed as shown in FIG. 19A, the logical operating circuit 43 produces such a signal as shown in FIG. 19B. This signal is subtracted from the original signal by the subtracting circuit 45 (FIG. 18) to allow such a signal as shown in FIG. 19C to be produced. Also, the logical operating circuit 44 produces such a signal as shown in FIG. 19D, which is subtracted from the original signal by the subtracting circuit 46 (FIG. 18) to permit such a signal as shown in FIG. 19E to be produced. These signals shown in FIGS. 19C and 19E are added to each other by the adding circuit 47 so as to form such a signal as shown in FIG. 19F. This signal is supplied to and added to the original signal with a proper level by the adding circuit 49 which produces a vertical aperture corrected signal shown in FIG. 19G.

Figure 20:
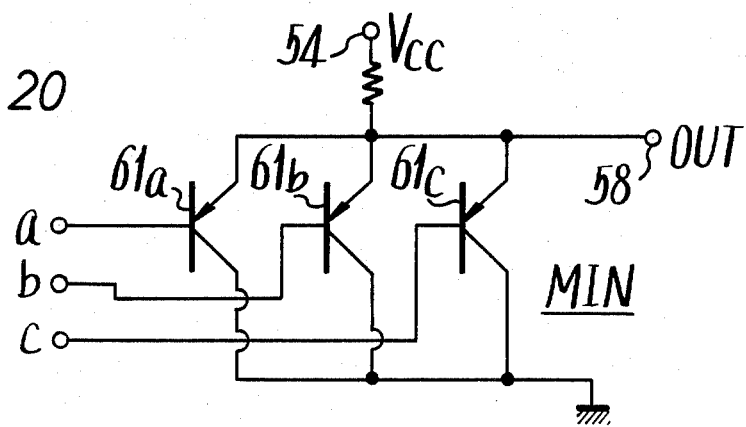
FIG. 20 is a connection diagram schematically showing a practical example of a logical operating circuit (analog AND) thereof.
Figure 21:
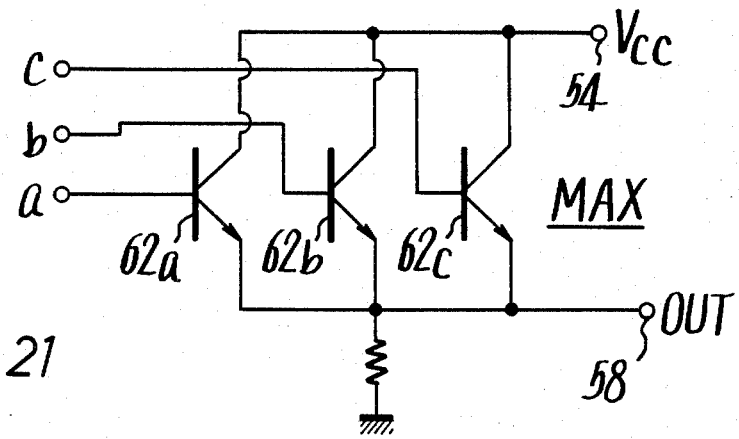
FIG. 21 is a connection diagram schematically showing a practical example of a logical operating circuit (analog OR) thereof.

The logical operating circuit 43 for the MIN output (analog AND) is composed of three pnp-type transistors 61a, 61b and 61c as, for example, shown in FIG. 20. Also, the logical operating circuit 44 for the MAX output (analog OR) is composed of three npn-type transistors 62a, 62b and 62c as, for example, shown in FIG. 21.

As stated above, in accordance with the filter circuit of this invention, it is possible to filter various signals in association with the desired purposes.

While in the aforesaid embodiment, the signals are all processed in the positive range, if the signal is processed in the positive and negative ranges, a similar filtering of the signal can be carried out.

Moreover, it may be also possible that before carrying out the filtering of the signal in accordance with the present invention, the prior art filter circuit is used to perform desired preprocessings for the signal.

Furthermore, the filter circuit of the present invention can perform the filtering in the multidimensional pattern space including the two dimensions.

Also, the filter circuit according to the present invention can be applied to both cases where the signal is processed in the form of analog and digital signals.

The above description is given on the preferred embodiments of the invention, but it will be apparent that many modifications and variations could be effected by one skilled in the art without departing from the spirit or scope of the novel concepts of the invention, so that the scope of the invention should be determined by the appended claims only.

We claim as our invention:

1. A filter circuit for eliminating noise from an input signal of known frequency content comprising:
    signal separating means receiving an input signal to be filtered including at least a first delay circuit for delaying said input signal by an amount equivalent to a period of the maximum frequency of said input signal to produce a first delay signal and a second delay circuit for delaying said first delay signal by an amount equivalent to a period of the maximum frequency of said input signal to produce a second delay signal, such that said input signal, said first delay signal, and said second delay signal represent adjacent ones of plural separated signals spaced apart from each other at predetermined different time points; and
    logical operating means having at least three input terminals each being supplied with a corresponding one of said plural separated signals from said signal separating means and including means for detecting a level of said input signal at said different time points for producing a filtered output signal having a desired waveform by processing said adjacent ones of said plural level detected separated signals based on a predetermined logical formula.

2. A filter circuit according to claim 1, wherein said logical operating means comprises at least two analog AND circuits, each supplied with said adjacent detected signals and at least one analog OR circuit supplied with the outputs of said at least two analog AND circuits, thereby said OR circuits produce a noise eliminated output signal.

3. A filter circuit according to claim 2, wherein each of said analog AND circuits comprises first and second transistors each having base electrodes supplied with said adjacent detected signals, respectively, emitter electrodes connected to a first potential through a common resistor, and collector electrodes connected to a second potential so that an output is obtained from the emitter electrodes of said first and second transistors.

4. A filter circuit according to claim 1, wherein said logical operating means comprises at least two analog OR circuits, each supplied with said adjacent detected signals and at least one analog AND circuit supplied with the outputs of said at least two analog OR circuits, whereby said AND circuit produces an output signal having noise substantially eliminated therefrom.

5. A filter circuit according to claim 4, wherein each of said analog OR circuits comprises first and second transistors each have base electrodes supplied with respective ones of said adjacent detected signals, emitter electrodes connected to a first potential though a common resistor, and collector electrodes connected to a second potential so that an output is obtained from the emitter electrodes of said first and second transistors.

6. A filter circuit according to claim 1, wherein said logical operating means processing adjacent signals based on a predetermined logical formula includes means for determining the minimum values of selected pairs of said signals and means for determining the maximum value of said determined minimum values.

7. A filter circuit according to claim 6, in which said means for determining said minimum values comprise pairs of npn transistors connected in common-emitter configuration, each pair receiving a corresponding one of said detected signals.

8. Filter circuit according to claim 1, in which said logical operating means processing detected signals based on a predetermined logical formula include means for determining the maximum values of selected pairs of said detected signals and means for determining the minimum value of said determined maximum values.

9. A filter circuit according to claim 8, in which said means for detecting said maximum values comprise pairs of pnp transistors connected in common-emitter configuration, each of said pairs being connected to receive a corresponding one of said detected signals.

10. A system for separating a chrominance and a luminance signal from a composite color video signal, comprising:
    filter means receiving said composite color video signal for separating the chrominance component and a high-frequency luminance component as a first signal and a low-frequency luminance component as a second signal;
    delay circuit means receiving said first signal and producing a plurality of time-delayed output signals therefrom in which each output signal is delayed in time relative to the next preceding signal by a predetermined time period;
    logical operating means receiving said plurality of time-delayed output signals for performing logical operations thereon and producing a logic output signal therefrom;
    signal combining means for adding a selected one of said plurality of time-delayed output signals to said logic output signal to produce said chrominance signal of said color video signal and for subtracting said logic output signal from said selected one of said time delayed output signal to produce a difference signal; and
    means for combining said difference signal and said low-frequency luminance component to form said luminance component of said color video signal.

11. A system according to claim 10, further comprising signal attenuator means connected to said chrominance signal produced by said signal combining means for lowering the level thereof.

12. A system according to claim 10, further comprising signal attenuator means connected to said difference signal produced by said signal combining means for lowering the level thereof.

13. A system according to claim 10, in which said filter means includes a bandpass filter receiving said composite color video signal and producing said chrominance signal combined with said high frequency luminance signal therefrom, and a low-pass filter receiving said composite color video signal for producing said low-frequency component of said luminance signal therefrom.

14. A system according to claim 10, in which said delay circuit means includes means for imparting relative time delays to said plurality of time-delayed output signals, including a delay of one horizontal video-scan period to a first output thereof, a delay of two horizontal video-scan periods to a second output thereof, and a third output signal having no relative time delay.

15. A system according to claim 10, further comprising means for adding a bias voltage to said plurality of time-delayed output signals from said delay circuit means for assuring that all of said plurality of time-delayed output signals have a positive voltage level.

16. A system according to claim 10, in which said logical operating means includes means for determining minimum values of selected pairs of said plurality of time-delayed output signals and means for determining the maximum of said determined minimum values.

17. A system according to claim 10, in which said logical operating means includes means for determining the maximum values of selected pairs of said plurality of time-delayed output signals and means for determining the minimum value of said determined maximum values.

18. A system according to claim 10, further comprising signal inverting and combining means connected to receive said plurality of time delayed output signals for combining and inverting respective ones of said plurality of time-delayed output signals and producing corresponding inverted-combined output signals fed to said logical operating means.

* * * * *